(12) United States Patent
Hao et al.

(10) Patent No.: US 6,306,702 B1
(45) Date of Patent: Oct. 23, 2001

(54) DUAL SPACER METHOD OF FORMING CMOS TRANSISTORS WITH SUBSTANTIALLY THE SAME SUB 0.25 MICRON GATE LENGTH

(75) Inventors: Ming Yin Hao, Sunnyvale; Richard P. Rouse, San Francisco; Zicheng Gary Ling, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/379,627

(22) Filed: Aug. 24, 1999

(51) Int. Cl.[7] .............................................. H01L 21/8238
(52) U.S. Cl. ........................................... 438/231; 438/199
(58) Field of Search ..................... 438/303, 231, 438/232, 229, 199, 200

(56) References Cited

U.S. PATENT DOCUMENTS

| 4,062,699 | 12/1977 | Armstrong | 438/276 |
|---|---|---|---|
| 4,145,459 | 3/1979 | Goel | 438/571 |
| 4,201,603 | 5/1980 | Scott, Jr. et al. | 438/585 |
| 4,209,349 | 6/1980 | Ho et al. | 438/306 |
| 4,209,350 | 6/1980 | Ho et al. | 438/305 |
| 4,366,613 | 1/1983 | Ogura et al. | 438/527 |
| 5,726,071 | * 3/1998 | Segawa et al. | 438/231 |
| 5,844,276 | * 12/1998 | Fulford, Jr. et al. | 257/371 |
| 5,943,565 | * 8/1999 | Ju | 438/231 |
| 6,124,610 | * 9/2000 | Cheek et al. | 257/344 |
| 6,157,064 | * 12/2000 | Huang | 257/344 |

\* cited by examiner

Primary Examiner—Michael Trinh

(57) ABSTRACT

CMOS transistors, i.e., N- and P-type transistors, are formed with substantially the same gate length and source/drain regions with lightly doped extensions. Embodiments include sequentially: ion implanting an N-type impurity, e.g. As, to form the N- type transistor shallow source/drain implants; forming relatively thin first sidewall spacers on the gates of both transistors; ion implanting a P-type impurity, e.g. $BF_2$, to form shallow source/drain extension implants for the P-type transistor; forming relatively thick side wall spacers on the first sidewall spacers of both transistors; ion implanting, e.g. As, to form moderately or heavily doped N-type implants; activation annealing at a first temperature, e.g., about 1050° C. to form the shallow N- and P-type source/drain extensions and moderately or heavily doped P-type source/drain regions; ion implanting a P-type impurity, e.g., $BF_2$, to form moderately or heavily doped P-type source/drain implants; and activation annealing at a second temperature less than the first temperature, e.g., at about 1000° C. to form moderately or heavily doped P type source/drain regions.

14 Claims, 3 Drawing Sheets

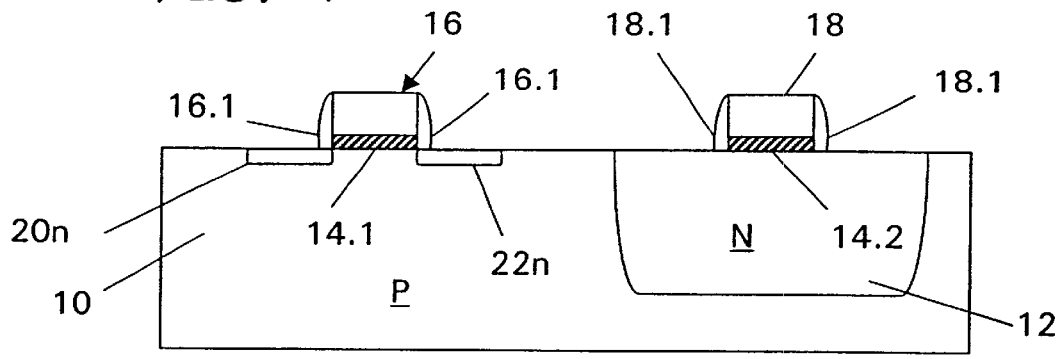
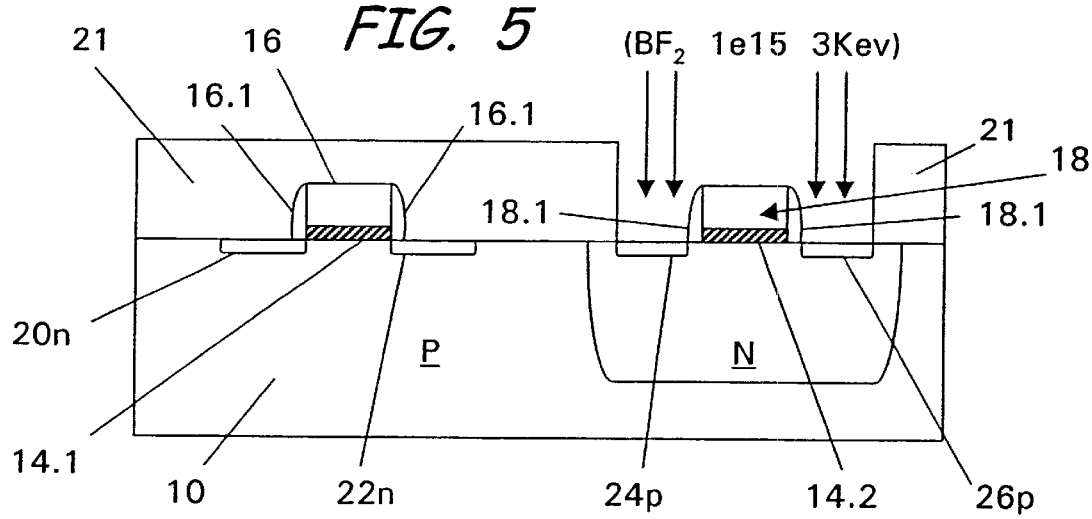
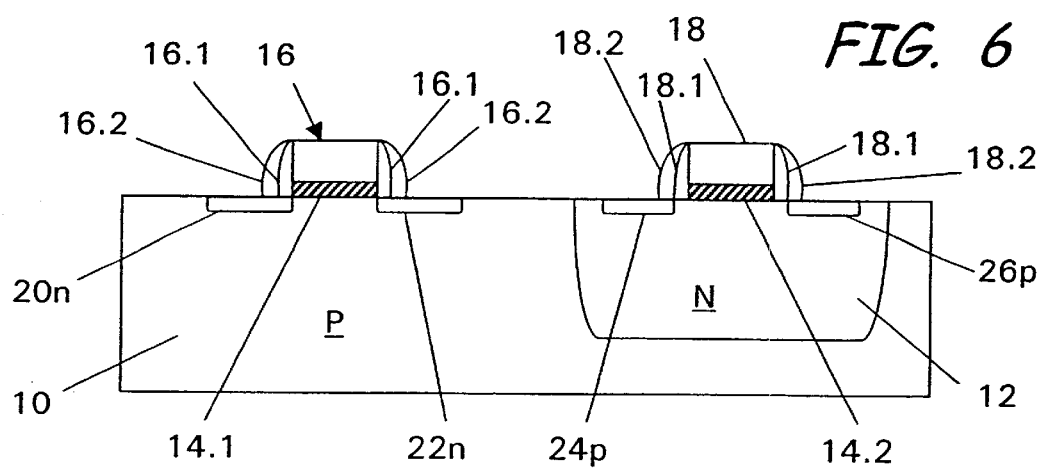

DUAL SPACER METHOD OF FORMING CMOS TRANSISTORS WITH SUBSTANTIALLY THE SAME SUB 0.25 MICRON GATE LENGTH

BACKGROUND OF THE INVENTION

1. Field of the Invention

The present invention relates generally to a method of forming highly dense, very small integrated circuits semiconductor devices. More particularly, this invention relates to a method for manufacturing an integrated circuit containing both NMOS and PMOS field effect transistors having substantially the same sub-micrometer gate lengths.

2. Description of the Related Art

In order to enable cost-efficient commercial production of integrated circuits which exhibit narrow line widths in the range of about 1 micrometer or less, it is necessary to use optical lithography techniques and to avoid the more expensive and complex techniques such as electron beam or X-ray lithography. In this connection, there has been significant efforts to develop processes for making submicrometer channel length field effect transistors with a high degree of channel length control. Examples of such work are described in "A New Edge-defined Approach for Sub-micrometer MOSFET Fabrication" by W. R. Hunter et al., IEEE Electron Device Letters, Vol. EDL-2 No. 1, January 1981, pp. 4–6, "Sub-micrometer Polysilicon Gate CMOS/SOS Technology" by A. C. Ipri et al. published in IEEE Transactions on Electron Devices, Vol. ED-27, No. 7, July 1980, pp. 1275–1279 and "A Novel Sub-micron Fabrication Technique" by T. N. Jackson et al. published in IEDM 1979 Conference Volume, pp. 58–61.

The W. R. Hunter document relies on the reactive ion etching technique to form a sidewall silicon dioxide. The Ipri et al. document utilizes a technique involving lateral diffusion of boron. The T. N. Jackson et al. method uses the plating of a metal on the edge of a conventionally patterned metal layer. Other short channel field effect transistor devices are illustrated in the W. E. Armstrong U.S. Pat. No. 4,062,699; J. Goel U.S. Pat. No. 4,145,459 and J. H. Scott, Jr. U.S. Pat. No. 4,201,603.

The Armstrong patent utilizes an ion implantation and diffusion process to narrow the channel length of his MOSFET. On the other hand, the Goel patent utilizes a process sequence that involves forming a recess in a portion of the semiconductor body and plating a metal film on each side of the recess until the spacing between the metal films across the recess is equal to desired length of the gate. The Scott, Jr. patent controllably dopes an edge of a polysilicon layer and then removes the undoped polysilicon by etching with an etchant which does not etch the doped polysilicon region. The above mentioned U.S. Pat. Nos. 4,209,349 and 4,209,350 also show processes for making sub-micrometer channel length devices with highly doped source/drain regions.

A particularly effective MOSFET configuration allowing high densities and performance is described in "A New Short Channel MOS FET with Lightly Doped Drain" by Saito et al. in Denshi Tsushin Rengo Taikai (Japanese), April 1978, page 2–20. The LDD (lightly doped drain) N channel MOS FET includes, in addition to the channel separating implanted N+ source/drain regions, the sub-micrometer diffused N- regions, which increases the channel breakdown voltage or snap-back voltage and reduces device drain junction electron impact ionization (and thus, hot electron emission) by spreading the high electric field at the drain pinch-off region into the N- region. This allows either an increase in power supply voltage or reduction in channel length at a given voltage to achieve performance enhancement. An improved process for making such a device is given in U.S. Pat. No. 4,366,613 S. Ogura and P. J. Tsang and entitled "Method of Fabricating High Speed High Density MOS Dynamic RAM With Lightly Doped Drain", in which the N- LDD region of the device is formed by a controlled N- ion implantation and forming sub-micrometer wide $SiO_2$ sidewall spacers abutting the gate.

In the above-mentioned patent to Ogura the formation of oxide sidewalls enables the prior formation of shallow lightly doped regions followed by subsequent implantation to form deeper, heavily doped contiguous regions. This reference further stresses the advantage of allowing ready fabrication of a self-aligned capacitance storage node. This is implemented by implanting a P-type impurity, e.g., boron, between a selected gate electrode and an adjacent insulation region, subsequent to reactive ion etching but prior to the formation of the capacitor plate and the N+ implant. Further merit is disclosed as residing in the fact that the LDD regions of the device allows the high electric field at the drain pinch-off region to be spread, thereby increasing the channel breakdown voltage or snap-back voltage and reducing hot electron emission for enhanced performance. The use of oxide sidewall spacers also protects the polysilicon gate from oxidation and prevents the formation of a reversed "bird's beak" that would normally form along two sides of the polysilicon gate during source/drain oxidation.

Nevertheless, it is difficult to form $N^-$ and $P^-$ channel transistors which have the same gate length (Leff) due to the large difference in diffusion and activation requirements of commonly used dopants. That is to say, in conventional arrangements wherein a combination of As and $BF_2$ is used for example, the activation temperature of As is higher than that required for $BF_2$. As a result, during annealing, the respective diffusions start at different times and, therefore, by the time the appropriate amount of diffusion of one is achieved, the other tends to be either excessive or insufficient.

Accordingly, there exists a need for a technique via which both NMOS and PMOS transistors can be formed with substantially the same gate length.

SUMMARY OF THE INVENTION

The present invention is based on the use of impurities of dopants which require different activation temperatures to form the source and drains of NMOS and PMOS transistors. This combination of impurities or dopants which exhibit different activation temperatures, coupled with the use of double spacers, enables the different dopants to be selectively deposited and selectively diffused in a manner that enables the formation of CMOS transistors with substantially the same gate length.

In an embodiment of the present invention, the dopants are arsenic (As) and boron difluoride ($BF_2$). The activation temperatures of these dopants are different, thereby allowing the use of different activation temperatures to control the amount of diffusion during fabrication. The use of a double insulating sidewall spacers, in combination with staged doping, allows diffusion of the dopants in such a manner to obtain substantially the same gate lengths of the CMOS transistors.

More specifically, an aspect of the invention resides in a method of forming N and P-type transistors having substantially the same gate lengths. This method features the steps of: (a) forming polysilicon gates for both NMOS and PMOS transistors on a substrate. (b) ion implanting an N-type impurity to form lightly doped source/drain extension implants of the first transistor; (c) forming first insulating sidewall spacers, having a first thickness, on the side surfaces of each of the first and second gates; (d) ion implanting a P-type impurity to form lightly doped source/drain extension implants of the second transistor; (e) forming second insulating sidewall spacers, typically thicker than first sidewall spacers; (f) ion implanting an N-type impurity to form moderately or heavily doped source/drain implants of the first transistor; (g) activation annealing at a first temperature to form moderately or heavily doped source/drain regions of the first transistor; (h) ion implanting a P-type impurity to form moderately or heavily doped source/drain implants of the second transistor; and (i) activation annealing at a second temperature, which is lower than the first temperature, to form moderately or heavily doped source/drain regions of the second transistor.

The N-type impurity can be As and the first portion of the substrate a P-doped or a P-well in a N-doped substrate. The P-type impurity can be boron difluoride; and the second portion of the substrate can be an N-doped substrate or an N-well in a P-doped substrate.

The above mentioned ion implanting in step (c) can be conducted at a dosage of about $2.0 \times 10^{+14}$ to about $2.0 \times 10^{+15}$ atoms cm$^{-2}$ and an energy about 3 to about 10 KeV, and the first thickness is about 100 Å to about 500 Å.

In step (d), ion implanting can be carried out at a dosage of about $2.0 \times 10^{+14}$ to about $2.0 \times 10^{+15}$ atoms cm$^{-2}$ and an energy about 3 to about 10 KeV. The second thickness is about 300 Å to about 1000 Å.

In step (f), ion implanting can be conducted at a dosage of about $1.0 \times 10^{+15}$ to about $4.0 \times 10^{+15}$ atoms cm$^{-2}$ and an energy about 20 to about 40 KeV.

In step (g), activation annealing can be carried out at a temperature of about 1000° C. to about 1050° C.; while in step (h) ion implanting can be carried out at a dosage of about $1.0 \times 10^{+15}$ to about $4.0 \times 10^{+15}$ atoms cm$^{-2}$ and an energy about 15 to about 30 KeV. In step (i), activation annealing can be conducted at a temperature of about 950° C. to about 1025° C. In step (g) activation annealing can be carried out for about 5 seconds to about 10 seconds; while in the case of step (i) the activation annealing is carried out for about 5 seconds to about 20 seconds.

BRIEF DESCRIPTION OF THE DRAWINGS

The various features and advantages of the present invention will become more clearly appreciated as a description of the embodiments is given with reference to the appended drawings in which:

FIG. 4 is a section view showing the formation of a first set of oxide wall spacers on the sides of the two gates;

FIG. 5 is a sectional view schematically depicting the formation of lightly doped P– extension implants adjacent the second gate following the formation of the above mentioned first set of oxide wall spacers;

FIG. 6 is a sectional view showing a second set of oxide wall spacers which are formed over the first set in accordance with an embodiment of the present invention;

DETAILED DESCRIPTION OF THE PREFERRED EMBODIMENTS

Figure 1:
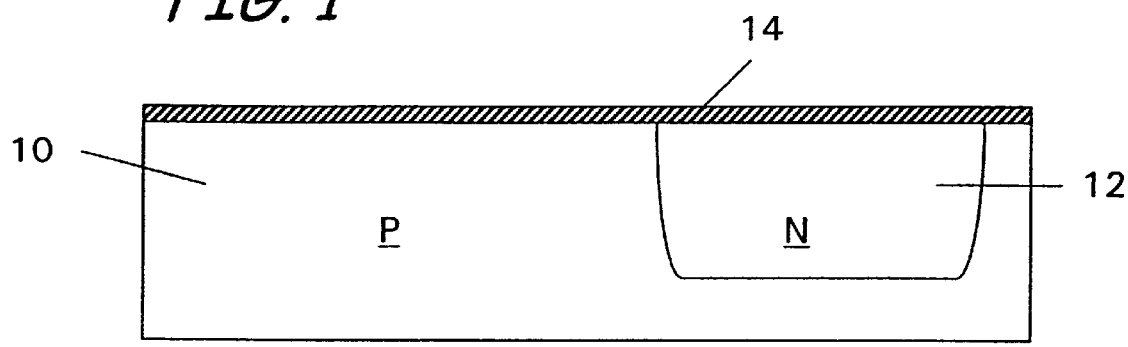
FIG. 1 is a sectional view showing a P-substrate formed with a N-well and an oxide layer.
Figure 2:
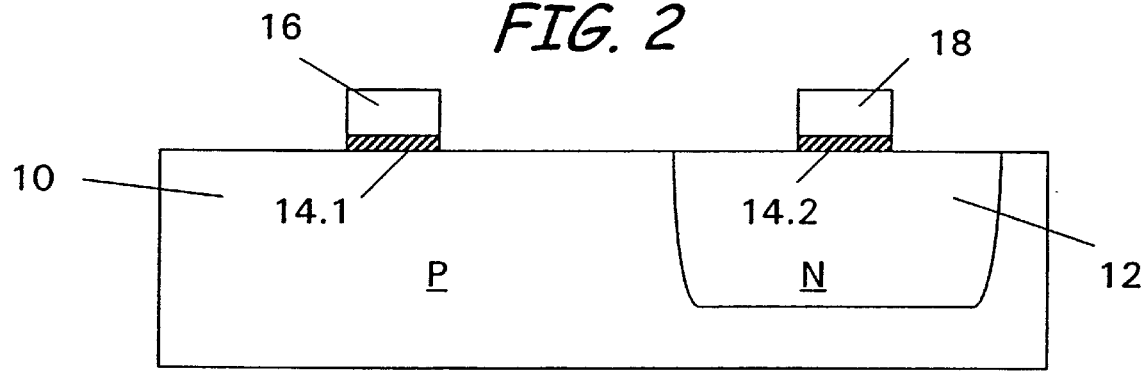
FIG. 2 is a sectional view of the above mentioned substrate on which two gates have been formed.
Figure 3:
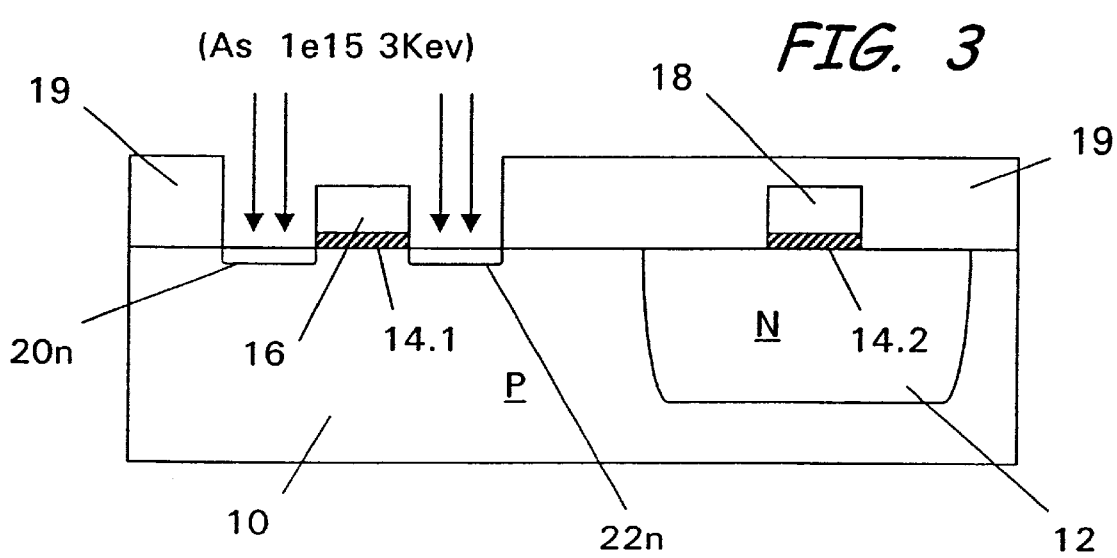
FIG. 3 is a sectional view schematically depicting the implantation of lightly doped N– extension implants adjacent the first gate.

FIGS. 1–9 illustrate stages of the formation of N-type (N-P-N) and P-type (P-N-P) transistors in accordance with an embodiment of the present invention. As is conventional, a P-doped substrate 10 is formed with an N-doped well 12. The upper surface of this substrate 10 is then oxidized to form a thin oxide film 14 in the manner schematically shown in FIG. 1. First and second gates 16, 18, are then formed in the manner depicted in FIG. 2. As will be appreciated, the first gate 16 is formed on the P-doped substrate while the second gate 18 is formed on the N-doped well 12. These first and second gates of course include the remnants of the oxide layer 14 in the form of gate oxides 14.1 and 14.2 respectively.

Following this, the surface of the substrate is masked with a photoresist 19 and the shallow source/drain extension implants 20n. 22n, which are associated with the first gate 16 and which are such as to form part of a N-P-N type transistor, are formed via arsenic implantation. This implantation can be carried out at a dosage of about $2.0 \times 10^{+14}$ to about $2.0 \times 10^{+15}$ atoms cm$^{-2}$ and an energy about 3 to about 10 KeV, by way of example.

The masking material 19 is removed, either by dissolution using a solvent or a suitable other technique. Following the removal of the photo resist material 19 which constitutes the mask, either an oxide, a nitride or an oxynitride layer (not shown) is formed over the top of both gates. This is followed by an anisotropic etching and results in the formation of a first set of insulating sidewall spacers 16.1. 18.1 in the manner depicted in FIG. 4. These sidewall spacers 16.1, 18.1 can be formed at a thickness of about 100 Å to about 500 Å, e.g., about 150 Å.

Next, as shown in FIG. 5, the first gate is masked 21 and the areas which are located beside the second gate 18, are lightly doped via BF$_2$ implantation to form the source/drain implant extensions 24p, 26p. This implantation is carried out using ion implantation and can be conducted at a dosage of about $2.0 \times 10^{14}$ to about $2.0 \times 10^{15}$ atoms cm$^{-2}$, e.g., $1 \times 10^{15}$ atoms cm$^{-2}$, and an energy of about 3 to about 10 KeV, e.g., about 3 KeV.

The masking material 21 is then removed and a second layer of oxide, nitride or oxynitride (not shown) is formed over the top of both gates using a conventional technique. A second anisotropic etching is then carried out to form the second set of insulating sidewall spacers 16.2, 18.2 which overlay the first spacers 16.1, 18.1, in the manner depicted in FIG. 6. These second set of spacers can be about 300 Å to about 1000 Å, e.g., about 300 Å.

Figure 7:
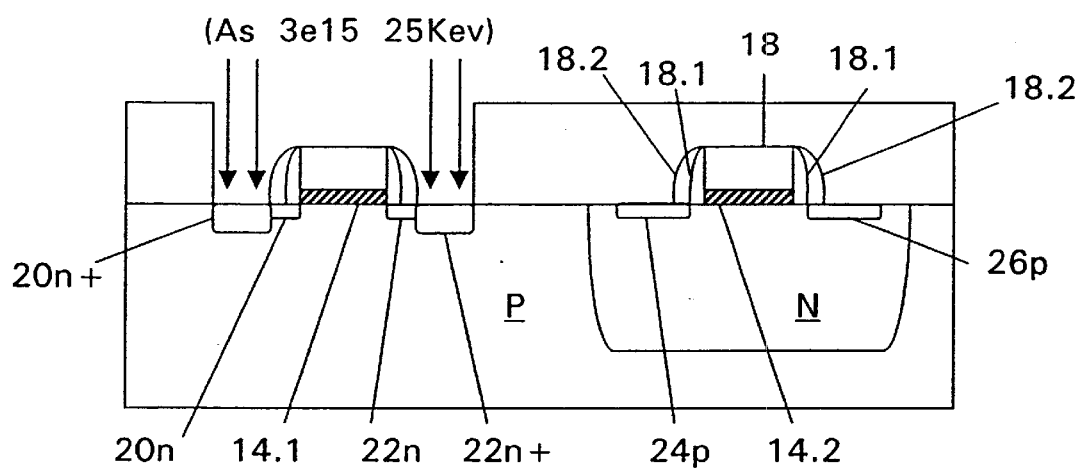
FIG. 7 is a sectional view schematically depicting the formation of heavily doped N+ implants on either side of the first gate.

This formation is then followed by masking the second gate 18 and associated shallow drain/source extension implants 24p, 26p and heavily doping the exposed portions of the first gate 16 with As in the manner schematically shown in FIG. 7. This implantation of As can be conducted at a dosage of about $1.0 \times 10^{15}$ to about $4.0 \times 10^{15}$ atoms cm$^{-2}$, e.g., about $1 \times 10^{15}$ atoms cm$^{-2}$, and an energy about 20 to about 40 KeV, e.g., about 25 KeV resulting in the formation of heavily doped N+ type source/drain implants 20n+, 22n+.

Following this, the first of two RTA (rapid thermal annealing) type annealing operations are carried out. This first RTA is conducted at about 1000° C. to about 1050° C., e.g., about 1050° C., for of about 5 seconds to about 20 seconds. In this instance, both the As and BF$_2$ dopants or impurities are activated and diffusion occurs to form implants which extend below the gate oxide layers 14.1, 14.2 in the manner depicted in FIG. 8.

Figure 8:
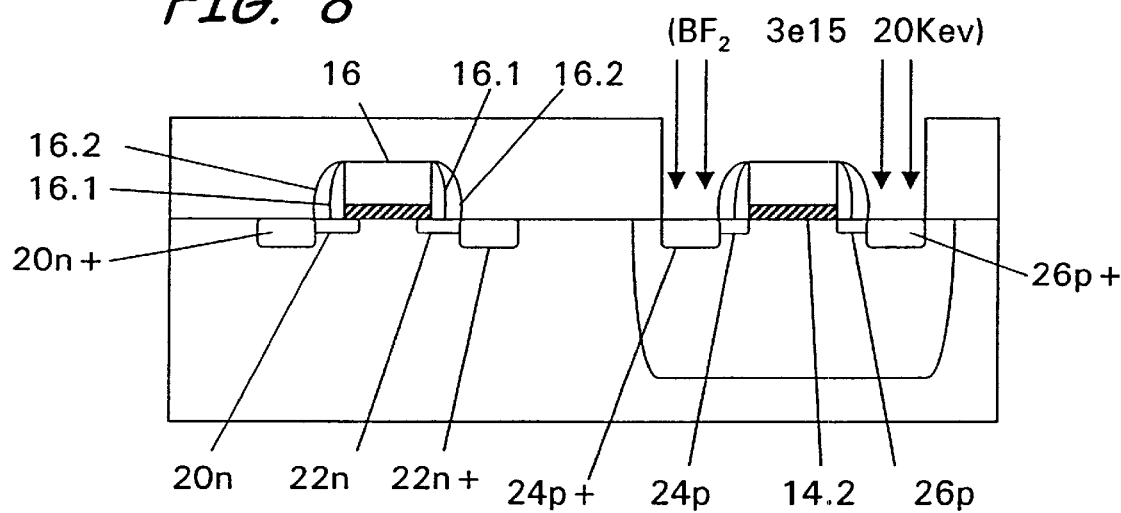
FIG. 8 is a sectional view schematically depicting the formation of heavily doped P+ implants on either side of the second gate following a first activation annealing process which is used to diffuse a dopant in the source/drain extension implants associated with the first gate.
Figure 9:
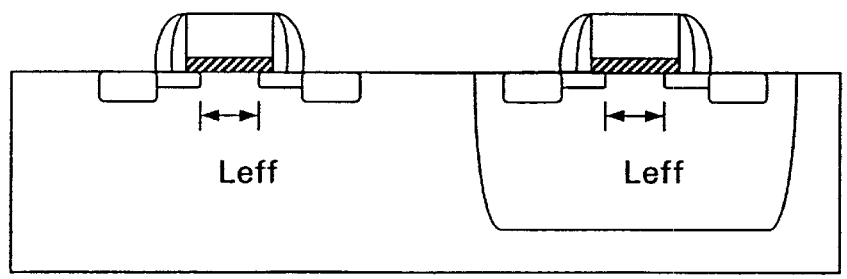
FIG. 9 is a sectional view depicting the structure which is obtained after a second annealing process which is used to diffuse the dopant in the source and drain implants associated with the second gate and to form the source and drain regions.

After this first annealing step, the first gate 16 is masked with photo resist and heavy doping is carried out using BF$_2$ in the manner depicted in FIG. 8. In this case, the implantation is carried out at a dosage of about $1.0 \times 10^{15}$ to about $4.0 \times 10^{15}$ atoms cm$^{-2}$ and an energy about 15 to about 30 KeV to form heavily doped P+ type source/drain implants 24p+, 26p+.

Next, the masking material is removed and a second RTA is carried out, at a temperature is high enough to activate the BF$_2$ but not high enough to have any effect on the previously diffused arsenic dopant, such about 950° C. to about 1025° C. e.g., about 1025° C. and about 5 seconds to about 10 seconds. This results in the structure shown in FIG. 9 wherein the gate lengths Leff of each of the N-P-N and P-N-P transistors is substantially about the same.

It will be appreciated, that while only a single preferred embodiment of the present invention is shown and described in the present disclosure, the concept of present invention is capable of being used in various other combinations and environments and is capable of changes or modifications within the scope of that expressed herein.

What is claimed is:

1. A method of manufacturing a semiconductor device containing NMOS and PMOS transistors having substantially the same gate lengths, the method comprising, in order, the steps of:
   (a) forming polysilicon gates having side surfaces for both the NMOS and PMOS transistors on a substrate;
   (b) masking the gate for the PMOS transistor and ion implanting an N-type impurity to form lightly doped source/drain extension implants for the NMOS transistor;
   (c) removing the mask and forming first insulating sidewall spacers, having a first thickness, on the side surfaces of each of the gates for the NMOS and PMOS transistors;
   (d) masking the gate for the NMOS transistor and ion implanting a P-type impurity to form lightly doped source/drain extension implants for the PMOS transistor;
   (e) removing the mask and forming second insulating sidewall spacers on the first insulating sidewall spacers, the second insulating sidewall spacers having a second thickness, greater than the first thickness;
   (f) masking the gate for the PMOS transistor and ion implanting an N-type impurity to form moderately or heavily doped source/drain implants for the NMOS transistor;
   (g) removing the mask and activation annealing at a first temperature to form moderately or heavily doped source/drain regions of the NMOS transistor;
   (h) masking the gate for the NMOS transistor and ion implanting a P-type impurity to form moderately or heavily doped source/drain implants of the PMOS transistor; and
   (i) removing the mask and activation annealing at a second temperature, lower than the first temperature, to form moderately or heavily doped source/drain regions of the PMOS transistor.

2. The method as set forth in claim 1, wherein:
   the N-type impurity is arsenic; and
   the NMOS transistor is formed on a P-doped substrate or a P-well in a N-doped substrate.

3. The method as set forth in claim 1, wherein:
   the P-type impurity is boron difluoride; and
   the PMOS transistor is formed on a an N-doped substrate or an N-well in a P-doped substrate.

4. The method as set forth in claim 1, comprising ion implanting in step (b) at a dosage of about $2.0 \times 10_{+14}$ to about $2.0 \times 10^{+15}$ atoms cm$^{-2}$ and an energy about 3 to about 10 KeV.

5. The method as set forth in claim 1, wherein the first thickness is from about 100 Å to about 500 Å.

6. The method as set forth in claim 1, comprising ion implanting in step (d) at a dosage of about $2.0 \times 10^{+14}$ to about $2.0 \times 10^{+15}$ atoms cm$^{-2}$ at an energy about 3 to about 10 KeV.

7. The method as set forth in claim wherein the second thickness is from about 300 Å to about 1000 Å.

8. The method as set forth in claim 1, comprising ion implanting in step (f) at a dosage of about $1.0 \times 10^{+15}$ to about $4.0 \times 10^{+15}$ atoms cm$^{-2}$ at an energy about 20 to about 40 KeV.

9. The method as set forth in claim 1, comprising activation annealing in step (g) at a temperature of about 1000° C. to about 1050° C.

10. The method as set forth in claim 1, comprising ion implanting in step (h) at a dosage of about $1.0 \times 10^{+15}$ to about $4.0 \times 10^{+15}$ atoms cm$^{-2}$ at an energy about 15 to about 30 KeV.

11. The method as set forth in claim 1, comprising activation annealing in step (i) at a temperature of about 950° C. to about 1025° C.

12. The method according to claim 9, comprising activation annealing in step (g) for about 5 seconds to about 10 seconds.

13. The method according to claim 9, comprising activation annealing in step (i) for about 5 seconds to about 20 seconds.

14. A method of manufacturing a semiconductor device containing NMOS and PMOS transistors having substantially the same gate lengths, the method comprising, in order, the steps of:
   (a) forming a first gate for the NMOS transistor, the first gate having side surfaces on a first portion of a substrate which is either a P-doped substrate or a P-well in a N-doped substrate;
   (b) forming a second gate for the PMOS transistor, the second gate having side surfaces on a second portion of the substrate which is either an N-doped substrate or an N-well in a P-doped substrate;
   (c) masking the gate for the PMOS transistor and ion implanting an N-type impurity to form shallow lightly doped source/drain extension implants for the NMOS transistor, the N-type impurity ion implanting being conducted at a dosage of about $2.0 \times 10^{+14}$ to about $2.0 \times 10^{+15}$ atoms cm$^{-2}$ at an energy about 3 to about 10 KeV;
   (d) removing the mask and forming first insulating sidewall spacers, having a first thickness of about 100 Å to about 500 Å, on the side surfaces of each of the gates for the NMOS and PMOS transistors;

(e) masking the gate for the NMOS transistor and ion implanting a P-type impurity to form shallow lightly doped source/drain extension implants for the PMOS transistor, the P-type ion implanting being conducted and a dosage of about $1.0 \times 10^{+14}$ to about $2.0 \times 10^{+15}$ atoms cm$^{-2}$ at an energy about 3 to about 10 KeV;

(f) removing the mask and forming second insulating sidewall spacers on the first insulating sidewall spacers, the second insulating sidewall spacers having a second thickness, greater than the first thickness, and in the range of about 300 Å to about 1000 Å

(g) masking the gate for the PMOS transistor and ion implanting an N-type impurity at a dosage of about $1.0 \times 10^{+15}$ about $4 \times 10^{+15}$ atoms cm$^{-2}$ and an energy about 20 to about 40 KeV, to form moderately or heavily doped source/drain implants for the NMOS transistor;

(h) removing the mask and activation annealing at a first temperature of about 1000° C. to about 1050° C. to form moderately or heavily doped source/drain regions of the NMOS transistor;

(i) masking the gate for the NMOS transistor and ion implanting a P-type impurity at a dosage of about $1.0 \times 10^{+15}$ to about $4.0 \times 10^{+15}$ atoms cm$^{-2}$ and an energy about 15 to about 30 KeV, to form moderately or heavily doped source/drain implants for the PMOS transistor; and (j) removing the mask and activation annealing at a second temperature of about 950° C. to about 1025° C. to form moderately or heavily doped source/drain regions of the PMOS transistor.

\* \* \* \* \*

UNITED STATES PATENT AND TRADEMARK OFFICE
CERTIFICATE OF CORRECTION

PATENT NO.  : 6,306,702 B1
DATED       : October 23, 2001
INVENTOR(S) : Ming Yin Hao et al.

Page 1 of 1

It is certified that error appears in the above-identified patent and that said Letters Patent is hereby corrected as shown below:

<u>Claim 4,</u>
Line 2, "change "$2.0 \times 10_{+14}$" to -- $2.0 \times 10^{+14}$ --

Signed and Sealed this

Ninth Day of April, 2002

Attest:

JAMES E. ROGAN
*Attesting Officer*       *Director of the United States Patent and Trademark Office*